United States Patent
Ueno et al.

(10) Patent No.: US 7,432,726 B2
(45) Date of Patent: Oct. 7, 2008

(54) PROBE

(75) Inventors: Tetsuji Ueno, Hyogo (JP); Yoshihiro Hirata, Osaka (JP); Kazunori Okada, Osaka (JP); Kazunori Kawase, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/553,064

(22) PCT Filed: Apr. 13, 2004

(86) PCT No.: PCT/JP2004/005269

§ 371 (c)(1),
(2), (4) Date: Aug. 11, 2006

(87) PCT Pub. No.: WO2004/092748

PCT Pub. Date: Oct. 28, 2004

(65) Prior Publication Data

US 2007/0001690 A1 Jan. 4, 2007

(30) Foreign Application Priority Data

Apr. 14, 2003 (JP) ............... 2003-108546

(51) Int. Cl.
*G01R 31/02* (2006.01)
(52) U.S. Cl. ................................. 324/754
(58) Field of Classification Search ............... 324/754, 324/761–762, 765, 158.1, 760; 29/843–844; 257/696, 48
See application file for complete search history.

(56) References Cited

U.S. PATENT DOCUMENTS

| 6,414,501 B2* | 7/2002 | Kim et al. ............... 324/754 |
| 6,452,407 B2* | 9/2002 | Khoury et al. .......... 324/754 |
| 6,614,243 B2* | 9/2003 | Klehn et al. ............ 324/750 |
| 6,900,653 B2* | 5/2005 | Yu et al. ................. 324/762 |
| 7,161,363 B2* | 1/2007 | Gleason et al. ......... 324/754 |

* cited by examiner

*Primary Examiner*—Jermele M. Hollington
*Assistant Examiner*—Tung X. Nguyen
(74) *Attorney, Agent, or Firm*—Meyertons, Hood, Kivlin, Kowert & Goetzel, P.C.; Eric B. Meyertons

(57) ABSTRACT

According to an embodiment, a probe coming into contact with an electrode pad of a measurement object comprises a connection terminal part integrally formed and connected to a substrate, a contact part having a tapered configuration, and a supporting part which supports the contact part. The contact part extending from an end of the supporting part has a sectional configuration which shares at least one side face with the supporting part.

3 Claims, 3 Drawing Sheets

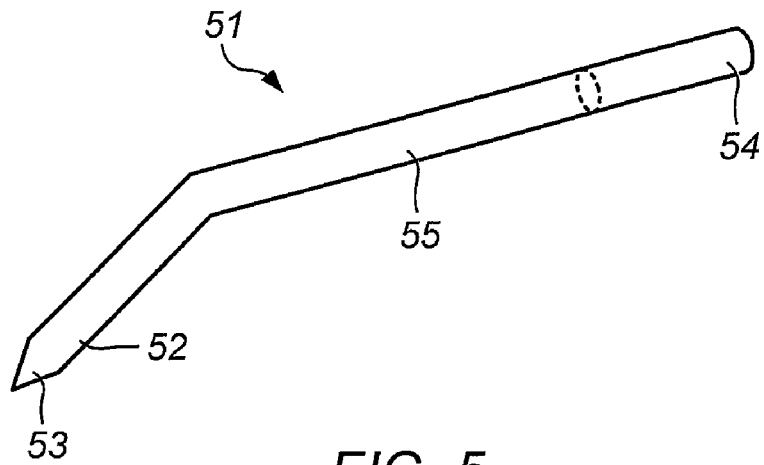
FIG. 5
*(PRIOR ART)*
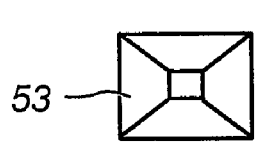
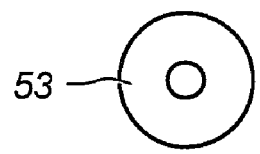
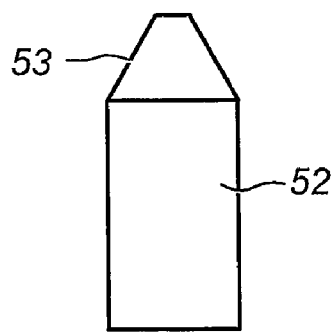
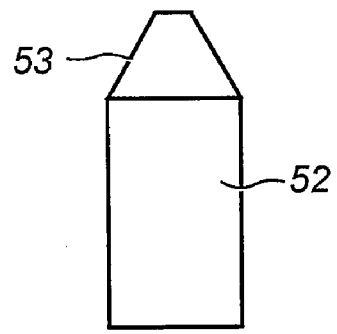
FIG. 6A
*(PRIOR ART)*
FIG. 6B
*(PRIOR ART)*

PROBE

BACKGROUND OF THE INVENTION

1. Field of the Invention

The present invention relates to a probe of a probe card for measuring electric characteristics of a semiconductor device such as an LSI chip.

2. Description of the Background Art

A probe of a probe card for measuring electric characteristics of a semiconductor device such as an LSI chip is pressed against (overdrive) an electrode pad of the semiconductor device.

Conventionally, the probe is formed by sharpening an end of a constant-length metal line having electric conductivity and having a circular section, into a sharp configuration such as a square pyramid or a circular cone by mechanical polishing or electrolytic polishing.

FIG. 5 is a schematic view showing a perspective structure of the conventional probe. A probe 51 is formed by cutting a tungsten line having a diameter off approximately 0.1 to 0.5 mm into a predetermined length and sharpening an edge part 53 of a contact part 52 by mechanical polishing or electrolytic polishing.

FIG. 6 is a schematic view showing a front and side face sectional structure of the end of the conventional probe. The edge part of the contact part has a sharp configuration such as a square pyramid shown in FIG. 6A or a circular cone shown in FIG. 6B. While the contact part 52 having such configuration is pressed against the electrode pad many times, the configuration of the edge part 53 is deformed and changes in shape.

Thus, according to the conventional probe, the contact part has the sharp edge part having the configuration such as the square pyramid or the circular cone, which causes not only a measurement defect because of the configuration variation, but also a measurement defect because of attachment of a foreign substance such as shavings of the electrode pad or aluminum powder generated by the contact with the electrode pad.

SUMMARY OF THE INVENTION

It is an object of the present invention to provide a high-quality probe which is not likely to be attached with a foreign substance, not likely to change in shape and keeps preferable electric contact for a long time, in the probe which comes in contact with an electrode pad of a measurement object.

In order to solve the above problems, a probe according to the present invention, which comes into contact with an electrode pad of a measurement object comprises a connection terminal part integrally formed and connected to a substrate, a contact part having a tapered configuration, and a supporting part which supports the contact part. The contact part extending from an end of the supporting part has a sectional configuration which shares at least one side face with the supporting part.

In addition, more specifically, the contact part is constituted so as to have a constant thickness.

Furthermore, the contact part integrally consists of the edge part and the supporting part is formed of an electrically conductive material having superior electric characteristics.

More further specifically, the contact part is formed of a metal material having elasticity.

BRIEF DESCRIPTION OF THE DRAWINGS

FIG. 5 is a schematic view showing a perspective structure of the conventional probe.

FIG. 6 is a schematic view showing a front and side face sectional structure of the end of the conventional probe.

DESCRIPTION OF THE PREFERRED EMBODIMENTS

Hereinafter, an embodiment of the present invention is described with reference to the drawings.

Figure 1:
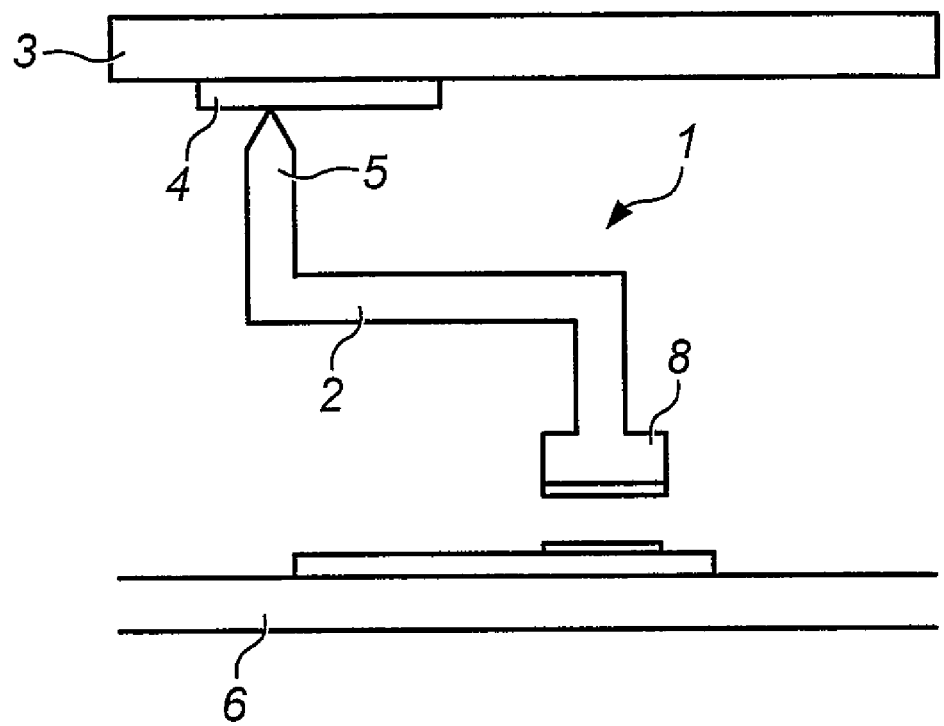
FIG. 1 is a schematic view showing a sectional structure of a part of a probe card including a probe according to an embodiment of the present invention.

FIG. 1 is a schematic view showing a sectional structure of a part of a probe card including a probe according to this embodiment of the present invention. A probe 1 comprises a supporting part 2, a contact part 5 whose edge is in contact with an aluminum Al electrode pad 4 of a measurement object 3 such as a semiconductor device chip at one end, and a connection terminal part 8 of a substrate 6 at the other end.

Figure 2:
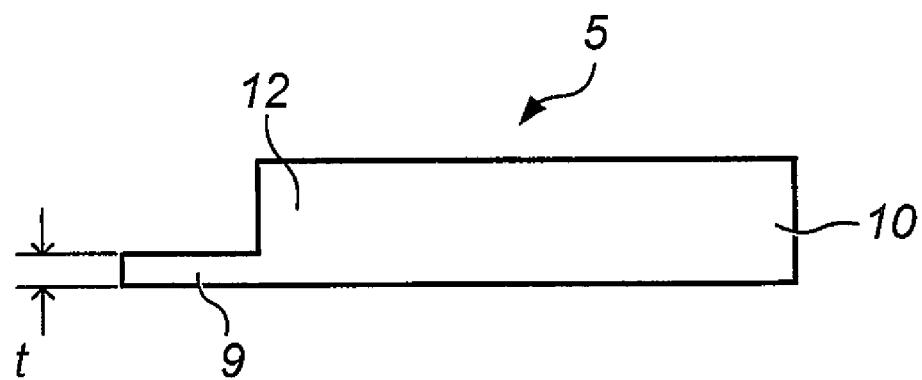
FIG. 2 is a schematic view showing an upper and side face sectional structure in which a part of an end of the probe according to the embodiment of the present invention is enlarged.

FIG. 2 is a schematic view showing an upper and side face sectional structure in which a part of the probe according to this embodiment of the present invention is enlarged. Referring to FIG. 2, a whole of the probe or at least the contact part 5 is integrally formed of an edge part 9 and a supporting part 10, and the edge part is formed so as to project from the supporting part. In addition, according to the present invention, the whole is formed of an electrically conductive material having excellent electric characteristics such as nickel Ni or palladium Pd. Furthermore, according to the present invention, it is characterized in that the whole is formed of the same metal material described above having elasticity in order to absorb a mechanical shock at the supporting part.

Figure 3:
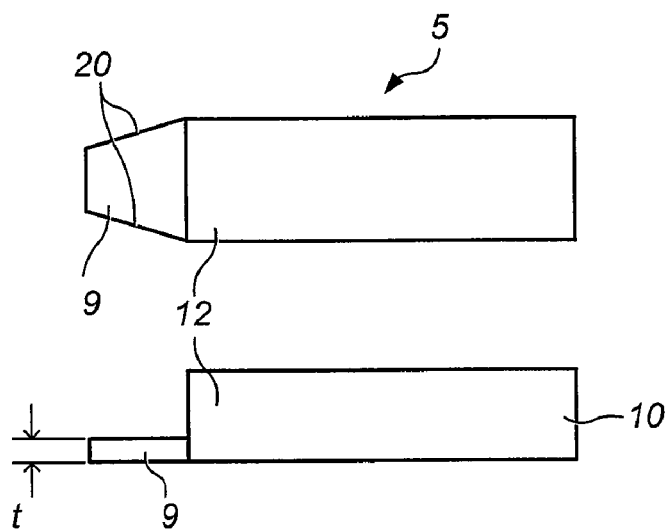
FIG. 3 is a schematic view showing an upper and side face sectional structure in which a part of an end of a probe according to another embodiment of the present invention is enlarged.

FIG. 3 is a schematic view showing an upper and side face sectional structure in which a part of an edge of a probe according to another embodiment of the present invention is enlarged. The contact part 5 is integrally formed and its edge part 13 is formed so as to project from the supporting part 10 also. In addition, the edge part 13 having a constant thickness of the contact part 5 is formed in the shape of a trapezoid such that both sides thereof are linear sides 20. Therefore, the edge part of the contact part has a minor diameter, so that a foreign substance such as shavings of the electrode pad is not likely to be attached to it. As a result, a conduction defect can be prevented.

Figure 4:
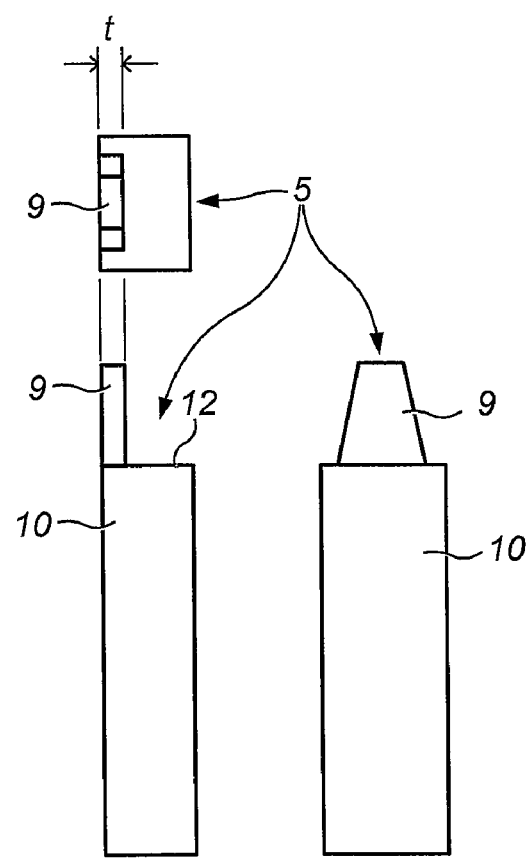
FIG. 4 is a schematic view showing a front and side face structure of the end of the probe according to the embodiment of the present invention.

FIG. 4 is a schematic view showing a front and side face structure of the probe edge of the embodiment of the present invention. Referring to FIG. 2, in the edge part of the contact part 5, the edge part 13 is formed so as to have a constant thickness t by extending the edge part 9 from an end 12 of the supporting part 10 so as to project from it. Therefore, the upper and side face structure of the contact part of the probe shown in FIG. 2 is provided as shown in FIG. 4. Thus, the edge part 13 keeps the configuration having the constant width of the thickness t even when the contact part 5 comes into contact with the electrode pad and worn away at each probing. As a result, even when the probe end is repeatedly recognized by a CCD camera, there is no recognition error and the edge part 13 of the contact part 5 of the probe 1 can be easily positioned According to a manufacturing method of the probe 1, since the contact part is integrally formed as described above in the present invention, it is simple as compared with the conventional method. That is, the metal material having elasticity and preferable electric characteristics such as nickel Ni and the like is selected, and the metal material is cut into the approximate shape of the probe shown in FIG. 1. In this case, it can be formed into the approximate shape shown in FIG. 1 by lithography and electroforming. In addition, the edge part is shaped by precision machine grinding or micro-electronic discharging, and thus the probe 1 is easily manufactured. Especially, the micro-electronic discharging is preferable because the probe edge having preferable electrical contact can be formed because of a carburizing effect. In addition, palladium, rhodium, platinum and the like are preferably used for the discharge electrode, because they are contained in a processing alteration layer and the electric contact is improved.

According to the present invention, since the edge part is provided to project from the end of the supporting part, and linear sides are provided at both sides of the edge part, the configuration of the edge part becomes a trapezoid and the edge part of the contact part has the minor diameter. As a result, since the foreign substance such as the shavings of the electrode pad is not likely to be attached thereto, the conduction defect can be prevented.

In addition, since the edge part of the contact part projects from the end of the supporting part so as to have the constant thickness width, even when the contact part comes into contact at each probing and worn away, the edge part keeps the constant width configuration and the probing can be repeatedly performed smoothly. Furthermore, the configuration of the probed mark keeps constant even after the contact part repeats contact.

As described above, according to the present invention, the contact part of the probe is integrally formed of the edge part and the supporting part, the edge part is formed so as to project from the supporting part, and the contact part has the configuration having the minor diameter because the edge part becomes the shape of the trapezoid. As a result, the foreign substance such as the shavings of the electrode pad is not likely to be attached thereto, whereby the conduction defect can be prevented.

What is claimed is:

1. A probe coming into contact with an electrode pad of a measurement object, comprising:
   a connection terminal part integrally formed and connected to a substrate;
   a probe support portion; and
   a contact part, the contact part comprising
      an edge part having a tapered end configuration; and
      a contact support part which supports the edge part and couples the edge part to the probe support part,
   wherein the contact part extends from the probe support part, and wherein the edge part has a sectional configuration which shares a side face with the contact support part and wherein the edge part has a thickness that is less than the thickness of the contact support part, and wherein the distance the edge part extends from the contact support part along the shared face is different than the distance the edge part extends from the contact support part along an opposite face.

2. The probe according to claim 1, wherein the contact part is formed of an electrically conductive material having superior electric characteristics.

3. The probe according to claim 1, wherein the contact part is formed of a metal material having elasticity.

* * * * *